United States Patent [19]

Yamauchi et al.

[11] Patent Number: 4,871,925

[45] Date of Patent: Oct. 3, 1989

[54] HIGH-VOLTAGE PULSE GENERATING APPARATUS

[75] Inventors: Kiyotaka Yamauchi; Yoshihito Yoshizawa; Shin Nakajima, all of Kumagaya, Japan

[73] Assignee: Hitachi Metals, Ltd., Tokyo, Japan

[21] Appl. No.: 261,296

[22] Filed: Oct. 24, 1988

[30] Foreign Application Priority Data

Oct. 23, 1987 [JP] Japan ................................ 62-267830

[51] Int. Cl.⁴ ........................ H03K 3/00; H01F 27/24; H01F 3/00

[52] U.S. Cl. .................................... 307/106; 307/415; 336/213; 335/297

[58] Field of Search ................ 307/106, 415; 336/213, 336/218, 219; 335/296, 297

[56] References Cited

U.S. PATENT DOCUMENTS

| | | | |
|---|---|---|---|
| 4,257,830 | 3/1981 | Tsuya et al. | 335/296 X |
| 4,262,233 | 4/1981 | Becker et al. | 336/218 X |
| 4,528,481 | 7/1985 | Becker et al. | 336/218 X |
| 4,549,091 | 10/1985 | Fahlen et al. | 307/415 X |
| 4,558,297 | 12/1985 | Shigeta et al. | 336/218 X |
| 4,587,507 | 5/1986 | Takayama et al. | 336/213 X |
| 4,689,163 | 8/1987 | Yamashita et al. | 335/296 X |

*Primary Examiner*—William M. Shoop, Jr.

*Assistant Examiner*—Sharon D. Logan

*Attorney, Agent, or Firm*—Sughrue, Mion, Zinn, Macpeak & Seas

[57] ABSTRACT

A high-voltage pulse generating apparatus having at least one magnetic switch comprising a magnetic core constituted by an Fe-base soft magnetic alloy ribbon wound in a toroidal form, the alloy having the composition represented by the general formula:

$$(Fe_{1-a}M_a)_{100-x-y-z-\alpha-\beta-\gamma}Cu_xSi_yB_zM'_{\alpha}M''_{\beta}X_{\gamma}$$

(by atomic %)

wherein M is Co and/or Ni, M' is at least one element selected from the group consisting of Nb, W, Ta, Zr, Hf, Ti and Mo, M'' is at least one element selected from the group consisting of V, Cr, Mn, Al, elements in the platinum group, Sc, Y, rare earth elements, Au, Zn, Sn and Re, X is at least one element selected from the group consisting of C, Ge, P, Ga, Sb, In, Be and As, and a, x, y, z, α, β and γ respectively satisfy $0 \leqq a \leqq 0.5$, $0.1 \leqq x \leqq 3$, $6 \leqq y \leqq 25$, $3 \leqq z \leqq 15$, $14 \leqq y+z \leqq 30$, $1 \leqq \alpha \leqq 10$, $0 \leqq \beta \leqq 10$ and $0 \leqq \gamma \leqq 10$, at least 50% of the alloy structure being fine crystalline particles consisting of a bcc Fe solid solution and having an average particle size of 500 Å or less.

10 Claims, 5 Drawing Sheets

HIGH-VOLTAGE PULSE GENERATING APPARATUS

BACKGROUND OF THE INVENTION

The present invention relates to a high-voltage pulse generating apparatus for linear accelerators, radars, excimer lasers, etc., which has at least one magnetic switch comprising a magnetic core made of an Fe-base soft magnetic alloy.

Pulses applied to such apparatuses as linear accelerators, excimer lasers, etc. have as extremely narrow widths as several tens n sec to several hundreds n sec, and it is necessary to use a pulse generator capable of generating high voltage more than several tens of kV. Further, energy of a single pulse is as large as several tens of joules or more and the repetition of such pulses is as much as 1 kHz or more. Under such severe conditions, the high-voltage pulse generating apparatus should be operated stably.

Conventionally used as a switch for high-voltage pulse generators is a thyratron and a spark gap, but their service lives are extremely short when used to generate high-power, narrow-width pulses as described above.

An alternative to the above apparatuses is a pulse compression circuit containing at least one magnetic switch constituted by an amorphous alloy magnetic core as shown in FIG. 1 [Japanese Patent Laid-Open Nos. 59-63704 and 60-96182, U.S. Pat. No. 4,275,317. etc.]. FIG. 1 schematically shows a 3-step pulse compression circuit containing 3 magnetic switches $S_1$, $S_2$ and $S_3$, but the use of n magnetic switches can provide a n-step pulse compression circuit with the same principle. In FIG. 1, to increase an energy transmitting efficiency, $C_1$ should be $C_2$, and the magnetic switches $S_1$, $S_2$ and $S_3$ should have successively decreasing inductance.

In FIG. 1, when first capacitor $C_1$ reaches a predetermined high voltage $V_1$, a switch SW is closed. At this time, current $I_1$ is extremely small because the magnetic switch $S_1$ has high impedance. However, when the magnetic switch $S_1$ becomes saturated, its impedance becomes extremely small. As a result, the charge in the capacitor $C_1$ flows into the second capacitor $C_2$ instantaneously, making the current $I_1$ extremely large in a very short time. A core constant of the magnetic switch $S_2$ is determined such that the magnetic switch $S_2$ can retain high impedance until the second capacitor $C_2$ is fully charged. Next, when the second capacitor $C_2$ reaches fully high voltage, a magnetic core of the second magnetic switch $S_2$ becomes saturated, permitting the charge of the second capacitor $C_2$ to flow into a pulse forming line (PFM). By repeating this action successively, the pulse is compressed as shown by $I_1$, $I_2$, $I_3$, and the compressed pulse $I_3$ is applied to a load 1. The compression of pulse is graphically shown in FIG. 2.

The magnetic core used for such a magnetic switch is required to have the following properties.

First, the magnetic switch operable in this manner is magnetized according to the relation derived from Maxwell electromagnetic equations:

$$VT = NS\Delta B. \quad (1)$$

V: Voltage applied to a magnetic switch.
T: Time during which the voltage is applied.
N: Number of winding of a magnetic switch core.
$\Delta B$: Variation of magnetic flux density.

Therefore, under the conditions that N and VT are constant, the larger $\Delta B$ the smaller S, which means that the cross section of the core can be reduced as much as possible, because a magnetic core volume is proportional to $1/(\Delta B)^2$. Here, the product of VT is determined from the condition that the second magnetic switch $S_2$ has high impedance until the second capacitor $C_2$ is fully charged. FIG. 3 schematically shows the magnetization of a magnetic switch core. Since the magnetic flux of the core changes along the line (b) from a starting point $-B_r$, the larger $\Delta B$ $(B_r+B_s)$, the more desirable the magnetic core, which means that a core material having larger saturation magnetic flux density $B_s$ and squareness ratio $(B_r/B_s)$ is more preferable.

Second, it is desirable that the magnetic switch has as large inductance $L_r$ in an unsaturated region and as small $L_{sat}$ in a saturated region as possible. This is because the compression of the pulse is proportional to $(L_{sat}/L_r)^{1/2}$.

To decrease $L_{sat}$, the following points are important:

(a) The core should have as large a squareness ratio as possible and its relative permeability after saturation should be as close to 1 as possible.

(b) The magnetic core should have as small a core volume as possible, and the inductance of the central space should be as small as possible. This condition is substantially the same as the above first condition.

To increase $L_r$, it is important to increase the permeability in an unsaturated region, and to reduce a length of a magnetic path in the core. With respect to the magnetic core material, it is important that it has a small core loss at high frequency, because if otherwise $H_c$ becomes large and the gradient of the line (b) in FIG. 3 which indicates $\mu_r=\Delta B/H_s$ becomes small. It is also important that the magnetic core has large $\Delta B$. Further, the magnetic core should have as small cross-section as possible.

Third, the variation of the above properties with time should be as small as possible.

In sum, with respect to the core material used for a magnetic switch, it is important that it has a large saturation magnetic flux density $B_s$, a large squareness ratio $B_r/B_s$, a small core loss at a high frequency and small variation of magnetic properties with time.

For such requirements, amprphous alloys are highly suitable, and they have been used conventionally. Typical amorphous alloys have such properties as $B_s$, $\Delta B$, $\mu_r$, core loss as shown in Table 1.

TABLE 1

| Sample No. | Composition (atomic %) | Heat Treatment Temperature (°C.) | $B_s$ (T) | $\Delta B$ (T) | $\mu_r$ | Core Volume (Relative Value) | Total Core Loss (Relative Value) |
|---|---|---|---|---|---|---|---|
| 1 | $Fe_{71}B_{13.5}Si_{13.5}C_2$ | 360 | 1.60 | 2.90 | 1400 | 1 | 4.35 |
| 2 | $Fe_{78}B_{13}Si_9$ | 400 | 1.55 | 2.84 | 360 | 1.04 | 17.1 |
| 3 | $Fe_{79}B_{16}Si_5$ | 420 | 1.58 | 2.21 | 4200 | 1.72 | 1.45 |
| 4 | $Fe_{73}Ni_5Si_{13}B_9$ | 400 | 1.44 | 2.75 | 1570 | 1.11 | 3.87 |
| 5 | $Co_{73.3}Fe_{0.7}Mn_3Si_{14}B_9$ | 220 | 0.83 | 1.57 | 6090 | 3.41 | 1 |
| 6 | Mn—Zn Ferrite | — | 0.48 | 0.72 | 5700 | 16.22 | 1.09 |

as follows:

The core loss is evaluated by a circuit shown in FIG. 4. FIG. 5 shows wave forms of voltage and current in various parts in the circuit in FIG. 4, and FIG. 6 the magnetization process of the magnetic core being evaluated.

In FIG. 4, when a semiconductor switch 1 is turned on, voltage $e_r$ as shown in FIG. 5 appears in a winding 2 in an opposite polarity to that shown by a dot in FIG. 4. Assuming that:

$$T_r > \frac{2 \cdot N_r \cdot A_e \cdot B_s}{E_r}, \quad (2)$$

$T_r$: Turn-on period of switch 3,
$N_r$: Number of winding of 2,
$A_e$: Effective cross-section of core 4, and
$E_r$: Voltage of power source 5, the magnetic core 4 is saturated at $-B_s$ in the third quadrant along the B-H loop in FIG. 6. Next, assuming:

$$T_p >> T_r \quad (3)$$

$T_p$: period, the magnetic flux density of the magnetic core 4 immediately before turning on the main switch 1 of a gate circuit is $-B_r$, a residual magnetic flux density in the B-H loop in FIG. 6. Next, when the main switch 1 is turned on, $$T_{on} > \frac{N_q \cdot A_e \cdot (B_s + B_r)}{E_g}, \quad (4)$$

$T_{on}$: Turn-on period of switch 1,
$N_g$: Number of winding of 6, and
$E_g$: voltage of power source 7, the magnetic core is saturated and magnetized to:

$$H_{Lm} = \frac{N_g \cdot I_{gm}}{l_e}, \quad (5)$$

$I_{gm}$: Maximum wave height of gate current $i_g$, and
$l_e$: Average magnetic path length of core 4.

In the above process, the magnetic core 4 is magnetized along the solid line in FIG. 6 during a period Ton between turn on and turn off of the main switch 1. Here, the following relation exists:

$$\Delta B = B_s + B_r = \frac{\int_0^{T_b} e_s \cdot dt}{N_s \cdot A_e}, \quad (6)$$

$N_s$: Number of winding of search coil.

On the other hand, as is clear from FIG. 6, $$\mu_r \approx \frac{\Delta B}{2 \cdot \mu_0 \cdot H_r} = \frac{B_s + B_r}{2 \cdot \mu_0 \cdot H_r}. \quad (7)$$

In addition, the magnetic core loss of a single pulse per unit volume is:

$$\frac{P_c}{f} H_r \cdot B. \quad (8)$$

The total core loss $P_{ct}$ of a magnetic core is related to $P_c$ as follows:

$$P_{ct} = A_e \cdot l_e \cdot P_c \quad (9)$$

In addition, the following relation generally exists:

$$A_e \cdot l_e \propto (1/\Delta B)^2 \quad (10)$$

The substitution of (9), (10) into (8) leads to the relation:

$$\frac{P_{ct}}{f} \propto \frac{H_r}{\Delta B}. \quad (11)$$

From equation (7), $$\frac{P_{ct}}{f} \propto \frac{1}{\mu_r}. \quad (12)$$

This means that the larger $\mu_r$, the smaller $P_{ct}$. Accordingly, by measurement with this evaluation circuit, it is verified that the larger ΔB, the smaller a saturable magnetic core, and that the larger $\mu_r$, the smaller a total magnetic core loss $P_{ct}/f$ of a single pulse.

Incidentally, cores shown in Table 1 are those constituted by amorphous alloy ribbons having a thickness of about 50 μm, with a polyimide insulating tape of 9 μm in thickness interposed between adjacent amorphous alloy ribbons. Each core has an outer diameter of 100 mm, an inner diameter of 60 mm and a height of 25 mm. Each magnetic core is heat-treated at an optimum temperature while applying a magnetic field of 800 A/m in parallel with each magnetic path. For comparison, a Mn-Zn ferrite core having the same size is also measured, and its data are shown in Table 1. Incidentally, by utilizing the relation that the core volume is proportional to $1/(\phi B)^2$, the core volume of each magnetic core is calculated by using ΔB, assuming that the core volume of No. 1 core is 1.

As is clear from Table 1, the ferrite core shows much smaller core loss than the amorphous alloy core (No. 1) , but the ferrite core's volume is about 16 times as that of No. 1 core because of small ΔB. Of course, since an amorphous alloy core has a small space factor (a ratio of amorphous alloy ribbon to an apparent volume of the core), its actual volume is not as large as shown in Table 1. But even if No. 1 core has a space factor of 0.60, the ferrite core is as large as about 6 times.

As is clear from Table 1, the amorphous alloys show better properties than the ferrite as core materials for magnetic switches, but the amorphous alloys having small core volumes show large core losses and vice versa. Thus, there are no amorphous alloy core materials with a good balance of magnetic properties. Specifically speaking, amorphous alloys are classified into Fe-base alloys and Co-base alloys, and the Fe-base amorphous alloys have large $B_s$ and core losses, while the Co-base amorphous alloys have small core losses and $B_s$. Because of this, the amorphous alloy cores developed heretofor are not necessarily satisfactory.

In addition, the amorphous alloys do not have sufficient stability with time.

OBJECT AND SUMMARY OF THE INVENTION

In view of the above problems with the conventional amorphous alloys, it has been desired to develop a high-voltage pulse generating apparatus having at least one magnetic switch composed of a new material with large $B_s$, small core loss and stability with time.

Therefore, an object of the present invention is to provide a high-voltage pulse generating apparatus having at least one magnetic switch comprising a magnetic core made of an Fe-base soft magnetic alloy with a good balance of magnetic properties.

The high-voltage pulse generating apparatus according to the present invention has at least one magnetic switch comprising a magnetic core constituted by an Fe-base soft magnetic alloy ribbon wound in a toroidal form, the alloy having the composition represented by the general formula:

$$(Fe_{1-a}M_a)_{100-x-y-z-\alpha-\beta-\gamma}Cu_xSi_yB_zM'_\alpha M''_\beta X_\gamma$$
(by atomic %)

wherein M is Co and/or Ni, M' is at least one element selected from the group consisting of Nb, W, Ta, Zr, Hf, Ti and Mo, M" is at least one element selected from the group consisting of V, Cr, Mn, Al, elements in the platinum group, Sc, Y, rare earth elements, Au. Zn, Sn and Re, X is at least one element selected from the group consisting of C, Ge, P, Ga. Sb, In, Be and As, and a, x, y, z, $\alpha$, $\beta$ and $\gamma$ respectively satisfy $0 \leqq a 0.5$, $0.1 \leqq x \leqq 3$, $6 \leqq y \leqq 25$, $3 \leqq z \leqq 15$, $14 \leqq y+z \leqq 30$, $1 \alpha \leqq 10$, $0 \leqq \beta \leqq 10$ and $0 \leqq \gamma \leqq 10$, , at least 50% of the alloy structure being fine crystalline particles consisting of a bcc Fe solid solution and having an average particle size of 500Å or less.

BRIEF DESCRIPTION OF THE DRAWINGS

FIG. 10 (*b*) is a schematic view showing the microstructure of the Fe-base soft magnetic alloy by transmission electron microscopy.

DETAILED DESCRIPTION OF THE INVENTION

Figure 1:
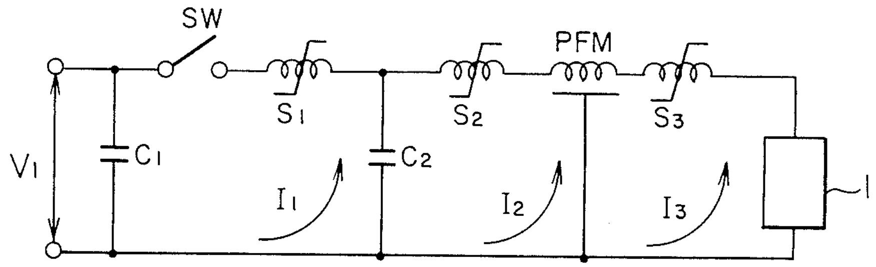
FIG. 1 is a schematic view showing a multi-step pulse compression circuit as a high-voltage pulse generating apparatus.
Figure 2:
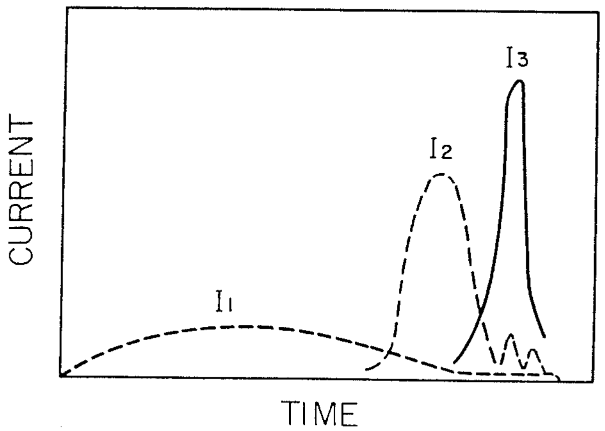
FIG. 2 is a graph schematically showing the compression of a pulse.
Figure 3:
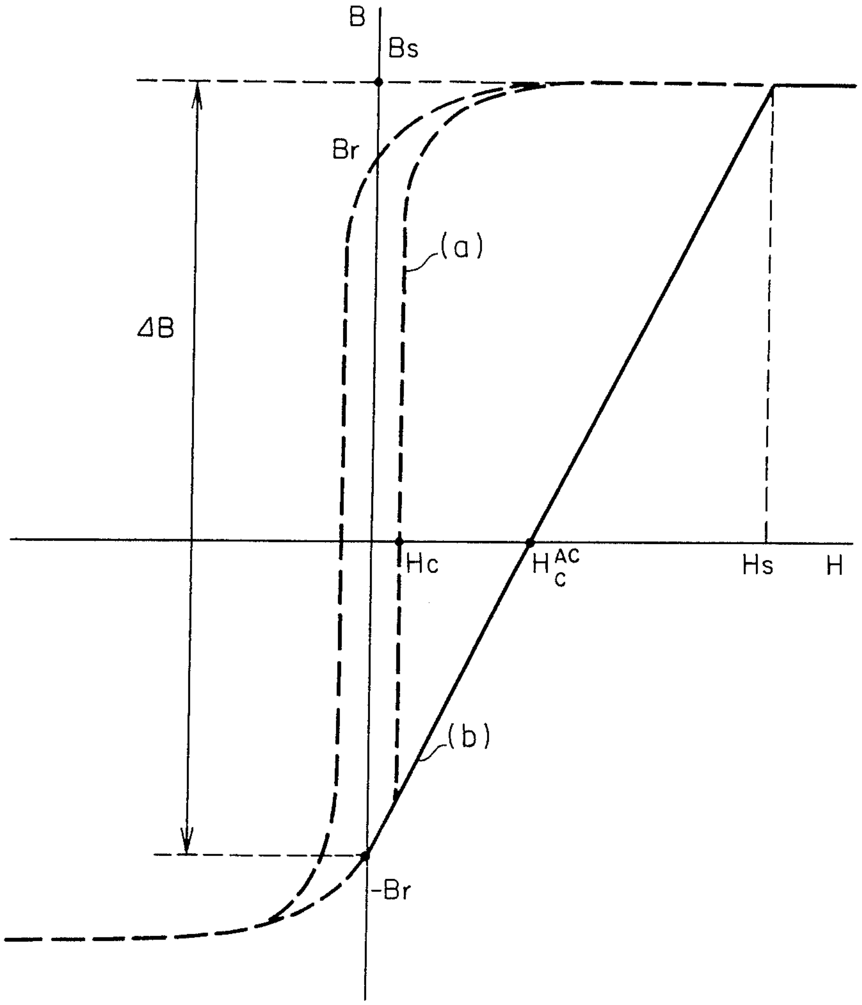
FIG. 3 is a graph schematically showing the magnetization of a magnetic switch core.

In the Fe-base soft magnetic alloy for forming a magnetic core used in the high-voltage pulse generating apparatus of the present invention, Fe may be substituted by Co and/or Ni in the range from 0 to 0.5. When "a" exceeds 0.5, the permeability $\mu_r$ of the magnetic core is deteriorated. However, to provide the alloy with small magnetostriction and high $\mu_r$, the content of Co and/or Ni which is represented by "a" is preferably 0–0.1.

In the present invention, Cu is an indispensable element, and its content "x" is 0.1–3 atomic %. When it is less than 0.1 atomic %, substantially no effect on the reduction of a core loss and on the increase in permeability can be obtained by the addition of Cu. On the other hand, when it exceeds 3 atomic %, the alloy's permeability $\mu_r$ undesirably decreases. The preferred content of Cu in the present invention is 0.5–2 atomic %, in which the core loss is particularly small and the permeability $\mu_r$ is high.

The reasons why the core loss decreases and the permeability increases by the addition of Cu are not fully clear, but it may be presumed as follows:

Since Cu and Fe have a positive interaction parameter which makes their solubility low, iron atoms and copper atoms tend to gather separately to form clusters when heat-treated, thereby producing compositional fluctuation. This in turn produces a lot of domains likely to be crystallized to provide nuclei for generating fine crystalline particles. These crystalline particles are based on Fe, and since Cu is substantially not soluble in Fe, Cu is ejected from the fine crystalline particles, whereby the Cu content in the vicinity of the crystalline particles becomes high. This presumably suppresses the growth of crystalline particles.

Because of the formation of a large number of nuclei and the suppression of the growth of crystalline particles by the addition of Cu, the crystalline particles are made fine, and this phenomenon is accelerated by the inclusion of Nb, Ta, W, Mo, Zr, Hf or Ti.

Without the addition of Cu, the crystalline particles are unlikely to be made fine. Instead, a compound phase is likely to be formed and crystallized, thereby deteriorating the magnetic properties of the alloy.

Si and B are elements particularly for making fine the alloy structure. This function is important because the Fe-base soft magnetic alloy is desirably produced by once forming an amorphous alloy with the addition of Si and B, and then forming fine crystalline particles by heat treatment.

Si and B also serve to control the magnetostriction of the alloy.

The content of Si ("y") and that of B ("z") are $6 \leqq y < 25$ atomic %, $3 \leqq z \leqq 15$ atomic %, and $14 \leqq y+z \leqq 30$ atomic %. When y exceeds 25 atomic %, the resulting alloy has a relatively large magnetostriction under the condition of good permeability, and when y is less than 6 atomic %, sufficient permeability is not necessarily obtained. The reasons for limiting the content of B("z") is that when z is less than 3 atomic %, uniform crystalline particle structure cannot easily be obtained, somewhat deteriorating the permeability, and when z exceeds 15 atomic %, the resulting alloy has a relatively large magnetostriction under the heat treatment condition of providing good permeability. With respect to the total amount of Si+B (y+z), when y+z is less than 14 atomic %, it is often difficult to make the alloy amorphous, providing relatively poor magnetic properties, and when y+z exceeds 30 atomic·% an extreme decrease in a saturation magnetic flux density and the deterioration of soft magnetic properties and the increase in magnetostriction ensue. Preferably, the contents of Si and B are $10 \leqq y \leqq 25$, $3 \leqq z \leqq 12$ and $18 \leqq y+z \leqq 28$, and this range provides the alloy with excellent soft magnetic properties, particularly a saturation magnetostriction in the range of $-5\times10-6-5\times10^{-6}$. Particularly preferred range is $11\leqq y\leqq24$, $3\leqq z\leqq9$ and $18\leqq y+z\leqq27$, and this range provides the alloy with a saturation magnetostriction in the range of $-1.5\times10^{-6}-+1.5\times10^{-6}$.

In the present invention, M' acts when added together with Cu to make the precipitated crystalline particles fine. M' is at least one element selected from the group consisting of Nb, W, Ta, Zr, Hf, Ti and Mo. These elements have a function of elevating the crystallization temperature of the alloy, and synergistically with Cu having a function of forming clusters and thus lowering the crystallization temperature, it suppresses the growth of the precipitated crystalline particles, thereby making them fine.

The content of M'(α) is 1-10 atomic %. When it is less than 1 atomic %, sufficient soft magnetic properties cannot be obtained, and when it exceeds 10 atomic % an extreme decrease in a saturation magnetic flux density ensues. The preferred content of M' is 2–8 atomic %, in which particularly excellent soft magnetic properties are obtained. Incidentally, most preferable as M' is Nb and/or Mo, and particularly Nb in terms of magnetic properties. The addition of M' provides the Fe-base soft magnetic alloy with as high permeability as that of the Co-base high-permeability materials.

M'', which is at least one element selected from the group consisting of V, Cr, Mn, Al, elements in the platinum group, Sc, Y, rare earth elements, Au, Zn, Sn and Re, is added for the purposes of improving corrosion resistance and magnetic properties and of adjusting magnetostriction, but its content is at most 10 atomic %. When the content of M'' exceeds 10 atomic %, an extreme decrease in a saturation magnetic flux density ensues. A particularly preferred amount of M'' is 8 atomic % or less.

Among them, at least one element selected from the group consisting of Ru, Rh, Pd, Os, Ir, Pt, Au, Cr and V is capable of providing the alloy with particularly excellent corrosion resistance and wear resistance.

The Fe-base soft magnetic alloy may contain 10 atomic % or less of at least one element X selected from the group consisting of C, Ge, P, Ga, Sb, In, Be and As. These elements are effective for making amorphous, and when added with Si and B, they help make the alloy amorphous and also are effective for adjusting the magnetostriction and Curie temperature of the alloy. The preferred amount of X is 5 atomic % or less.

In sum, in the Fe-base soft magnetic alloy having the general formula:

$$(Fe_{1-a}M_a)_{100-x-y-z-\alpha-\beta-\gamma}Cu_xSi_yB_zM'_\alpha M''_\beta X_\gamma,$$
(by atomic %)

the general ranges of a, x, y. z, $\gamma$, $\beta$ and $\gamma$ are $0\leqq a\leqq0.5$
$0.1\leqq x\leqq3$
$6\leqq y\leqq25$
$3\leqq z\leqq15$
$14\leqq y+z\leqq30$
$1\leqq\alpha\leqq10$
$0\leqq\beta\leqq10$
$0\leqq\gamma\leqq10$, and the preferred ranges are
$0\leqq a\leqq0.1$
$0.5\leqq x\leqq2$
$10\leqq y\leqq25$
$3>z\leqq12$
$2\leqq\alpha\leqq8$
$\beta\leqq8$
$\gamma\leqq5$.

In the Fe-base soft magnetic alloy having the above composition according to the present invention, at least 50% of the alloy structure consists of fine crystalline particles. These crystalline particles are based on α-Fe having a bcc structure, in which Si and B, etc. are dissolved. These crystalline particles have an extremely small average particle size of 500 Å or less, and are uniformly distributed in the alloy structure. Incidentally, the average particle size of the crystalline particles is determined by measuring the maximum size of each particle and averaging them. When the average particle size exceeds 500 Å. good soft magnetic properties are not obtained. It is preferably 200 Å or less and particularly 50–200 Å. The remaining portion of the alloy structure other than the fine crystalline particles is mainly amorphous. Even with fine crystalline particles occupying substantially 100% of the alloy structure, the Fe-base soft magnetic alloy of the present invention has sufficiently good magnetic properties.

The Fe-base soft magnetic alloy may be substantially composed of the above fine crystalline particles, but its alloy structure may contain an amorphous phase, compound phases such as $Fe_2B$, Nb, etc., regular phases such as $Fe_3Si$, etc. However, since the compound phases such as $Fe_2B$ tend to deteriorate the magnetic properties, they should be as little as possible.

Incidentally, with respect to inevitable impurities such as N, O, S, etc., it is to be noted that the inclusion thereof in such amounts as not to deteriorate the desired properties is not regarded as changing the alloy composition suitable for magnetic cores, etc.

Next, the method of producing the Fe-base soft magnetic alloy of the present invention will be explained in detail below.

First, a melt of the above composition is rapidly quenched by known liquid quenching methods such as a single roll method, a double roll method, etc. to form amorphous alloy ribbons. Usually amorphous alloy ribbons produced by the single roll method, etc. have a thickness of 5–100 μm or so, and those having a thickness of 25 μm or less are particularly suitable as magnetic core materials for use in magnetic switches.

These amorphous alloys may contain crystal phases, but the alloy structure is preferably amorphous to make sure the formation of uniform fine crystalline particles by a subsequent heat treatment.

The amorphous ribbons are wound, punched, etched or subjected to any other working to desired shapes before heat treatment, for the reasons that the ribbons have good workability in an amorphous state, but that once crystallized they lose workability.

The heat treatment is carried out by heating the amorphous alloy ribbon worked to have the desired shape in vacuum or in an inert gas atmosphere such as hydrogen, nitrogen, argon, etc. The temperature and time of the heat treatment varies depending upon the composition of the amorphous alloy ribbon and the shape and size of a magnetic core made from the amorphous alloy ribbon, etc., but in general it is preferably 450°–700° C. for 5 minutes to 24 hours. When the heat treatment temperature is lower than 450° C., crystallization is unlikely to take place with ease, requiring too much time for the heat treatment. On the other hand, when it exceeds 700° C. coarse crystalline particles tend to be formed, making it difficult to obtain fine crystalline particles. And with respect to the heat treatment time, when it is shorter than 5 minutes, it is difficult to heat the overall worked alloy at uniform temperature, providing uneven magnetic properties, and when it is longer than 24 hours, productivity becomes too low and also the crystalline particles grow excessively, resulting in the deterioration of magnetic properties. The preferred heat treatment conditions are, taking into consideration practicality and uniform temperature control, etc.. 500°-650° C. for 5 minutes to 6 hours.

The heat treatment atmosphere is preferably an inert gas atmosphere, but it may be an oxidizing atmosphere such as the air. Cooling may be carried out properly in the air or in a furnace. And the heat treatment may be conducted by a plurality of steps. Further, the heat treatment of the magnetic core can be carried out by applying current or a high-frequency magnetic field to generate heat in the core.

The heat treatment can be carried out in a magnetic field to provide the alloy with magnetic anisotropy. When a magnetic field is applied in parallel to the magnetic path of a magnetic core in the heat treatment step, the resulting heat-treated magnetic core has a good squareness in a B-H curve thereof, thereby increasing $\Delta B$.

The magnetic field need not be applied always during the heat treatment, and it is necessary only when the alloy is at a temperature lower than the Curie temperature Tc thereof. In the present invention, the alloy has an elevated Curie temperature because of crystallization than the amorphous counterpart, and so the heat treatment in a magnetic field can be carried out at temperatures higher than the Curie temperature of the corresponding amorphous alloy. In a case of the heat treatment in a magnetic field, it may be carried out by two or more steps. Also, a rotational magnetic field can be applied during the heat treatment.

Tension or compression force may be applied to the magnetic core during the heat treatment to improve the magnetic properties of the core.

To use the magnetic core for a magnetic switch to which high voltage is applied, it is desired that either or both of the ribbon surfaces are partially or totally coated with an insulating layer, thereby preventing the electrical discharge between the adjacent ribbons. This insulating layer can be formed by various method. For instance, it can be formed by attaching insulating powder such as $SiO_2$, MgO, $Al_2O_3$, etc. to the ribbon surface by immersion, spraying, electrophoresis, etc. A thin layer of $SiO_2$, etc. may be formed by sputtering or vapor deposition. Alternatively, a mixture of a solution of modified alkylsilicate in alcohol with an acid may be applied to the ribbon. Further, a forsterite ($MgSiO_4$) layer may be formed by heat treatment. Further, a sol obtained by partially hydrolyzing $SiO_2$-$TiO_2$ metal alkoxide may be mixed with various ceramic powder, and the resulting mixture may be applied to the ribbon. Further, a solution mainly containing a polytitanocarbosilane may be applied to the ribbon and then heated. Further, a phosphate solution may be applied and heated. In addition, the insulating layer may be chromium oxide or silicon oxide formed by oxidation of the ribbon surface. Or an agent for forming nitride may be applied to form an insulating layer.

The wound core may consist of the alloy ribbon and an insulating tape interposed between the adjacent ribbon layers. This wound core can be formed by laying the insulating tape on the ribbon and winding them. This insulating tape may be a polyimide tape, a ceramic fiber insulating tape, a polyester tape, an aramide tape, a glass fiber tape, etc.

When a highly heat-insulating tape is used, the wound core containing such tape may be subjected to heat treatment.

In the case of a laminated core, an insulating thin film is inserted between the adjacent layers to achieve insulation between the alloy sheet layers. In this case, materials having flexibility, such as ceramics, glass, mica, etc. may be used for the insulating thin film. When these materials are used, heat treatment can be conducted after lamination.

The magnetic core constituted by the Fe-base soft magnetic alloy ribbon does not suffer from extreme deterioration of magnetic properties which is commonly experienced by conventional Fe-base amorphous magnetic cores, even when impregnated with resins. The resin impregnation is usually conducted after heat treatment, but when a heat-resistant impregnant is used, it may be conducted before heat treatment. Further in this case, the resin impregnation and the heat treatment can be conducted simultaneously.

The impregnants include epoxy resins, polyimide resins, varnishes based on modified alkylsilicates, silicone resins, etc.

When the amorphous ribbon is produced by a single roll method, it may be wound with its surface contacted with the roll surface either inside or outside. However, when it is wound together with an insulating tape, the ribbon's surface contacted with the roll surface should face outside to increase the space factor of the resulting wound core. In addition, tension is desirably applied while winding to increase the space factor.

In the case of a wound core, an inner end and an outer end of the ribbon should be fixed to the wound core body to prevent loosening of the wound core. The fixing of the ribbon ends can be conducted by applying a laser beam or electric energy to spots for fixing, or by using an adhesive or an adhesive tape.

The magnetic core with its ribbon ends fixed is not likely to be loosened during the heat treatment, and even after the heat treatment, it is easily handled.

The resulting magnetic cores may be combined with each other in series or with magnetic cores of other materials.

Incidentally, the Fe-base soft magnetic alloy ribbon may desirably be plated with corrosion-resistant metals to prevent corrosion. Further, after it is wound around a central core made of non-magnetic metals or insulating materials, the resulting magnetic core is wrapped with a tape.

The central core and the wrapping tape may be made of non-magnetic materials such as stainless steel, brass, aluminum, phenol resins, ceramics, etc.

Particularly when rust is a serious problem, a cooling oil having high breakdown voltage is circulated in the magnetic core to cool it.

When the magnetic core is a large one, a support metal may be disposed in the center or periphery of the magnetic core, or it may be tightened with a metal belt, to prevent the deformation of the magnetic core.

Particularly when the magnetic core has a magnetostriction as small as $-5\times10^{-6}$ to $+5\times10^{-6}$, the breakage of the insulating layer and the deterioration of permeability $\mu_r$ due to magnetomechanical resonance can be made less likely, thereby providing a high-voltage pulse generator with high reliability.

In addition, since the Fe-base soft magnetic alloy used in the present invention is based on fine crystalline phases, its induced magnetic anisotropy is smaller than those of Co-base amorphous alloys and Fe-base amorphous alloys. As a result, the magnetic core made of the Fe-base soft magnetic alloy shows magnetic properties less changeable with time.

The present invention will be explained in detail by the following Examples, without intention of restricting the scope of the present invention.

EXAMPLE 1

Figure 9:
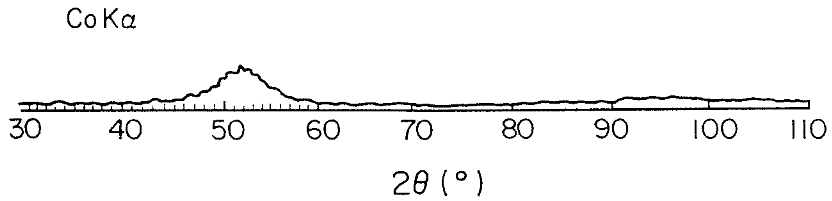
FIG. 9 is a graph showing the X-ray diffraction pattern of an Fe-base amorphous alloy.

A melt having the composition (by atomic %) of 1% Cu, 16.5% Si, 6% B, 3% Nb and balance substantially Fe was formed into a ribbon of 25 mm in width and 15 $\mu$m in thickness by a single roll method. The X-ray diffraction of this ribbon showed a halo pattern peculiar to an amorphous alloy as shown in FIG. 9.

Next, this amorphous alloy ribbon was coated with an MgO layer having a thickness of about 3 $\mu$m by an electrophoresis method, and then formed into a toroidal wound core of 60 mm in inner diameter and 100 mm in outer diameter. The toroidal core was heat-treated in a nitrogen gas atmosphere. During the entire period of this heat treatment, the core was subjected to a magnetic field of 800 A/m in parallel with the magnetic path of the core (along the longitudinal direction of the ribbon]. The heat treatment was conducted by heating the core to 510° C. at a heating rate of 10° C./min, keeping it at this temperature for one hour and cooling it to room temperature at a rate of 2.5° C./min.

Figure 10:
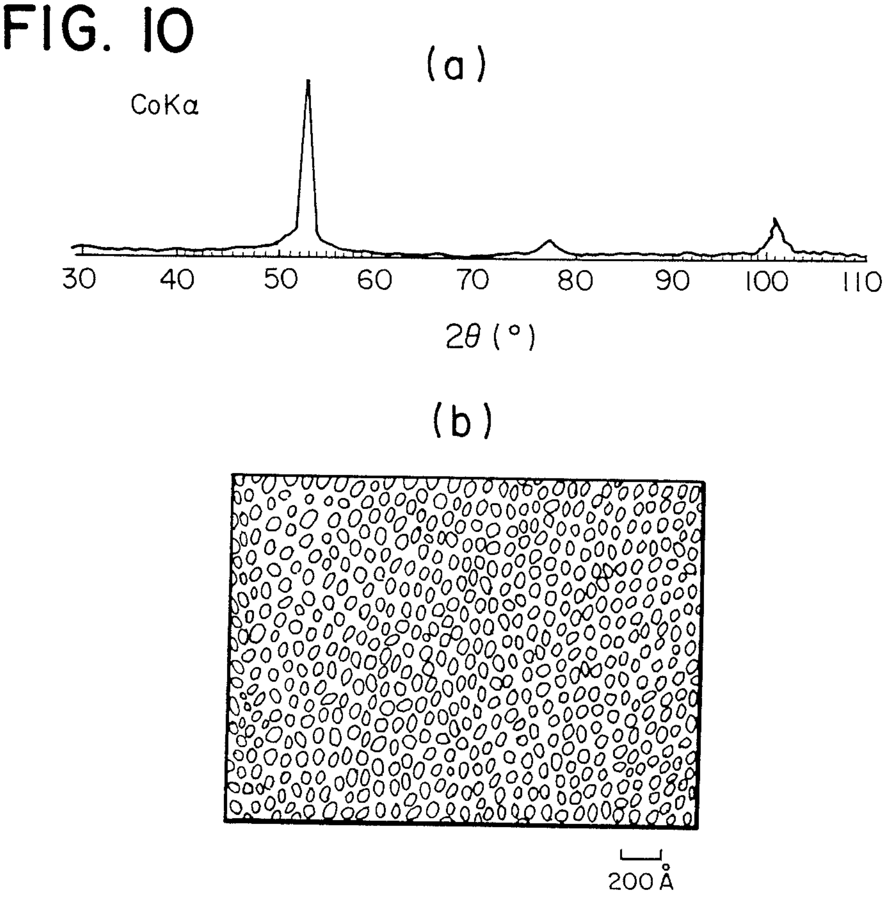
FIG. 10 (*a*) is a graph showing the X-ray diffraction pattern of the Fe-base soft magnetic alloy according to the present invention.

The X-ray diffraction pattern of the alloy after the heat treatment showed peaks of crystalline phases as shown in FIG. 10 (*a*). FIG. 10 (*b*) schematically shows a transmission electron photomicrograph of the ribbon after the heat treatment.

It was observed from the transmission electron photomicrograph that a majority of the microstructure of the ribbon after the heat treatment consisted of fine crystalline particles. The crystalline particles had an average particle size of about 100 Å. The alloy containing both Cu and Nb for use in magnetic switches of the high-voltage pulse generating apparatus according to the present invention contained crystalline particles almost in a spherical shape having an average particle size of about 100 Å. It was confirmed from the X-ray diffraction pattern and the transmission electron photomicrograph that the crystalline particles were composed of an Fe solid solution in a bcc structure in which Si, etc. were dissolved. When Cu is not contained, the crystalline particles tend to grow excessively, and compound phases are likely to be formed, resulting in deteriorated soft magnetic properties. It was thus confirmed that the addition of both Cu and Nb led to extreme change in size and shape of the crystalline particles.

Figure 4:
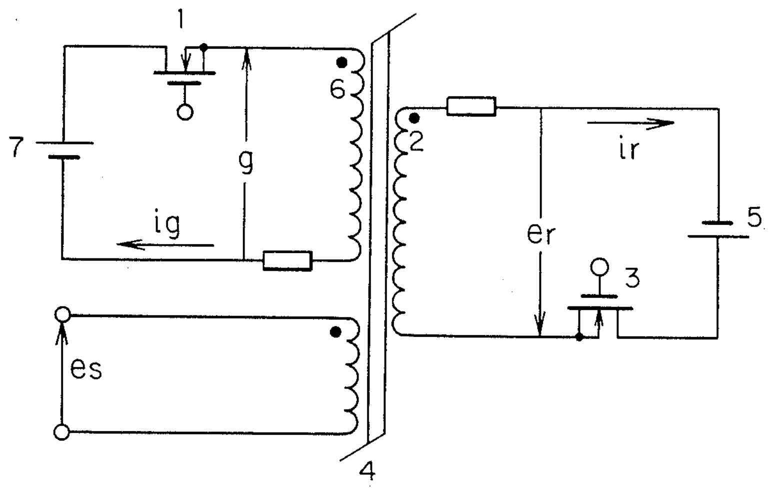
FIG. 4 is a schematic view showing an apparatus of evaluating the magnetic core.
Figure 5:
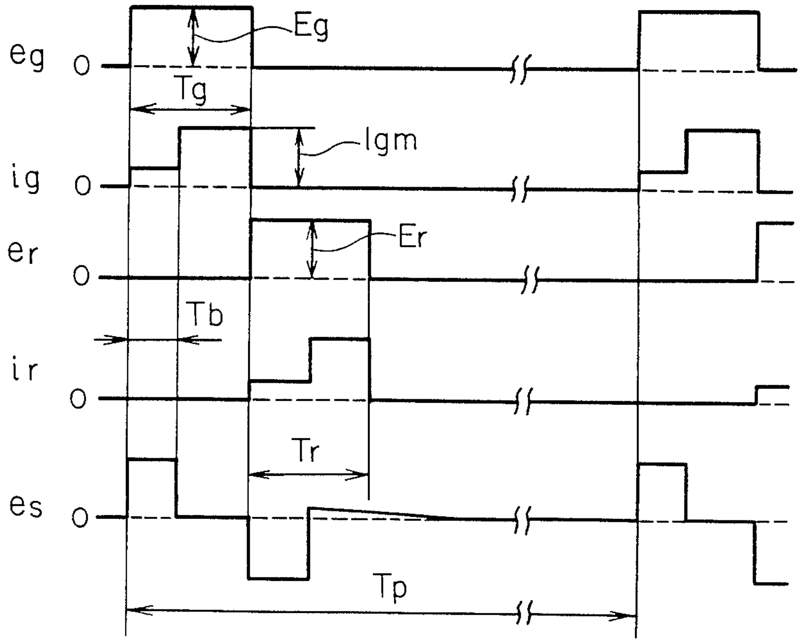
FIG. 5 is a graph showing wave forms of voltage and current in various parts of the core-evaluating apparatus in FIG. 4.
Figure 6:
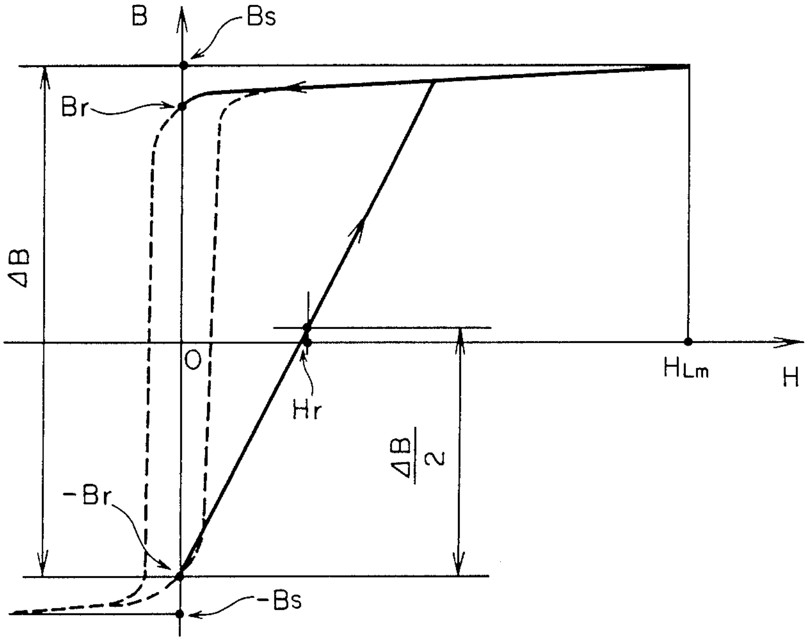
FIG. 6 is a graph showing the magnetization pattern of the core for explaining $H_r$ and $\mu_r$.

Next, the toroidal core subjected to the heat treatment was evaluated by a DC magnetization measurement apparatus and an evaluation apparatus shown in FIG. 4. The results are shown in Table 2. For comparison, Sample No. 1 in Table 1 and a sample of Co$_{69.5}$FE$_{0.5}$Mn$_{65}$Si$_{15}$B$_9$, which were coated with MgO, were also measured, and the results are shown in Table 2.

TABLE 2

| Sample No. | Composition (atomic %) | Heat Treatment Temperature (°C.) | $B_s$ (T) | $\Delta B$ (T) | $\mu_r$ | Core Volume (Relative Value) | Total Core Loss (Relative Value) |
|---|---|---|---|---|---|---|---|
| 1 | $Fe_{bal.}Cu_1Nb_3Si_{16.5}B_6$ | 510 | 1.20 | 2.28 | 6100 | 0.92 | 0.84 |
| 2 | $Fe_{bal.}B_{13.5}Si_{13.5}C_2$ | 360 | 1.60 | 2.19 | 800 | 1 | 6.38 |
| 3 | $Co_{69.5}Fe_{0.5}Mn_6Si_{15}B_9$ | 220 | 0.83 | 1.53 | 5100 | 2.05 | 1 |

Note:
Sample No. 1: Example in the present invention
Sample Nos. 2 and 3: Conventional alloy As is clear from Table 2, the magnetic core of the present invention has a smaller core volume and a smaller core loss than those of the Fe-base amorphous alloy (No. 1) and the Co-base amorphous alloy (No. 5). It should be noted that the Fe-base amorphous alloy has small $\Delta B$ though it has high $B_s$. The reason therefor is that since the Fe-base amorphous alloy has large magnetostriction, strain due to the MgO coating serves to keep its squareness ratio from increasing.

Figure 7:
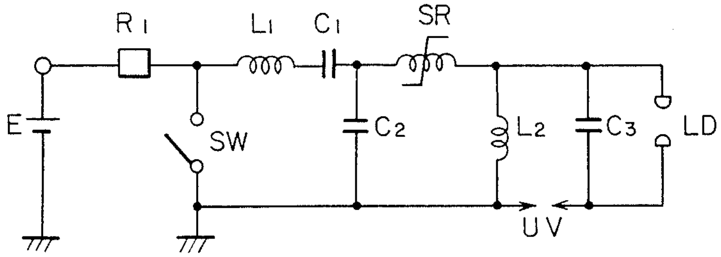
FIG. 7 is a schematic view showing an oscillation circuit for an excimer laser.
Figure 8:
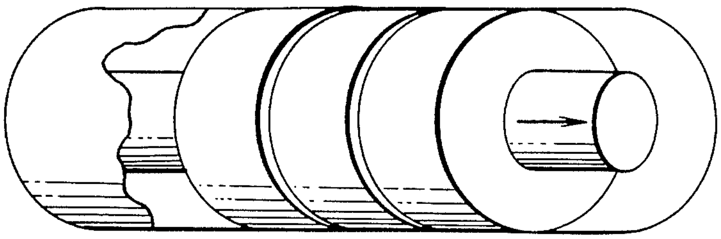
FIG. 8 is a schematic perspective view showing a magnetic switch containing a plurality of cores connected in series.

Next, the above magnetic core of the present invention and those of Sample Nos. 1 and 5 were used in a magnetic switch in the circuit shown in FIG. 7 for generating the oscillation of an excimer laser. Comparison was conducted in an actual apparatus in which six magnetic cores were used in series as shown in FIG. 8 for a magnetic switch, each core having an outer diameter of 170 mm, an inner diameter of 80 mm and a height of 25 mm with MgO insulation and a space factor of 64%. The results are shown in Table 3.

TABLE 3

| | Alloy of the Present Invention | Conventional Alloy | |
|---|---|---|---|
| Composition (atomic %) | $Fe_{bal.}Cu_1Nb_3Si_{16.5}B_6$ | $Fe_{bal.}B_{13.5}Si_{13.5}C_2$ | $Co_{73.3}Fe_{0.7}Mn_3Si_{14}B_9$ |
| Capacitance (nF) | $C_1/C_2 = 15/15$ | $C_1/C_2 = 15/15$ | $C_1/C_2 = 15/15$ |
| Compression Ratio | 5.0 | 5.0 | 4.5 |
| SR Core Loss (J) | 0.85 | 4.3 | 1.2 |
| Transmitting Efficiency of Capacitor Energy (%) | 84 | 37 | 75 |
| Laser Energy (mJ) | 89 | 34 | 78 |

As is clear from Table 3, to achieve the miniaturization of the magnetic core and the increase in the compression ratio, it is important that $\Delta B$ is large, but if the core loss is large, the energy transmission efficiency is lowered, thereby extremely decreasing laser energy output. And when the operation is repeated many times, the temperature of the magnetic core is elevated by large heat generation due to the core loss. Accordingly, as a magnetic core material for a magnetic switch, attention should be paid to the core loss first and then to $\Delta B$.

Reviewing Table 3 with this point in mind, it is found that the excimer laser using the Fe-base soft magnetic alloy according to the present invention shows high transmission efficiency of capacitor energy and sufficient compression ratio as compared with those using any conventional Fe-base amorphous alloys and Co-base amorphous alloys.

EXAMPLE 2

A melt consisting of 1% Cu, 3% Nb, 13.5% Si, 9% B and balance Fe by atomic % was formed into a ribbon of 15 μm in thickness and 25 mm in width by a single roll method. As a result of an X-ray diffraction analysis, it showed a halo pattern peculiar to an amorphous alloy. The crystallization temperature of this alloy was measured by differential scanning calorimetry (DSC) at a heating rate of 10° C./min. As a result, it was 508° C.

Next, this alloy ribbon was coated with an MgO insulating layer of about 3 μm in thickness, and then it was wound to provide a toroidal core of 100 mm in outer diameter and 60 mm in inner diameter and 25 mm in height.

This core was heat-treated in an $N_2$ gas atmosphere. The heat treatment was conducted by heating the core to 550° C. at a heating rate of 20° C./min, keeping it at this temperature for 1 hour and then cooling it to 250° C. at a rate of 2° C./min, while applying a magnetic field of 800 A/m during the entire process. After that, the application of the magnetic field was stopped and then the heat-treated magnetic core was taken out of a furnace and cooled to room temperature by blowing a nitrogen gas.

As a result of transmission electron microscopy and X-ray diffraction analysis, it was found that the core material of the heat-treated magnetic core showed the same microstructure as in Example 1.

The magnetic core of the present invention had $B_s$ of 1.24 T, ΔB of 2.35 T, and $\mu_r$ of 6300. Its core volume was 0.87 and its total core loss was 0.81 in comparison with Table 2. It is clear that in all of these properties, the magnetic core of the present invention is superior to those made of the conventional amorphous alloys.

EXAMPLE 3

A melt consisting of 1% Cu, 3% Nb, 7% Si, 9% B and balance Fe by atomic % was formed into a ribbon of 18 μm in thickness and 25 mm in width by a single roll method. As a result of an X-ray diffraction analysis, it showed a halo pattern peculiar to an amorphous alloy. The crystallization temperature of this alloy was measured by differential scanning calorimetry (DSC) at a heating rate of 10° C./min. As a result, it was 414° C.

Next, this alloy ribbon was coated with an mica powder by electrophoresis, and then it was wound to provide a toroidal core of 60 mm in outer diameter and 30 mm in inner diameter.

This core was heat-treated in an Ar gas atmosphere. The heat treatment was conducted by heating it to 570° C. at a heating rate of 10° C./min, keeping it at this temperature for 1 hour and then cooling it by air. As a result of transmission electron microscopy, the core material of the heat-treated magnetic core showed the same microstructure as in Example 1.

Magnetic properties ($B_s$, ΔB and $\mu_r$), core volume and total core loss of the magnetic core according to the present invention and those of the conventional magnetic cores having the same size and produced by a similar coating method are shown in Table 4. It is clear from Table 4 that in magnetic core volume and total core loss, the magnetic core of the present invention is superior to those made of the conventional amorphous alloys.

TABLE 4

| Sample No. | Composition (atomic %) | Heat Treatment Temperature (°C.) | $B_s$ (T) | ΔB (T) | $\mu_r$ | Core Volume (Relative Value) | Total Core Loss (Relative Value) |
|---|---|---|---|---|---|---|---|
| 1 | $Fe_{bal.}Cu_1Nb_3Si_7B_9$ | 570 | 1.48 | 2.71 | 5400 | 0.69 | 0.96 |
| 2 | $Fe_{bal.}B_{13.5}Si_{13.5}C_2$ | 360 | 1.60 | 2.24 | 950 | 1 | 5.47 |
| 3 | $Co_{69.5}Fe_{0.5}Mn_6Si_{15}B_9$ | 220 | 0.83 | 1.57 | 5200 | 2.04 | 1 |

Note:
Sample No. 1: Example in the present invention
Sample Nos. 2 and 3: Conventional alloy

EXAMPLE 4

Amorphous ribbons of 15 mm in width and 18 μm in thickness and having the composition shown in Table 5 were produced by a single roll method, and each of the ribbons was coated with an MgO insulating layer of 3 μm in thickness. It was then wound into a toroidal core of 60 mm in outer diameter and 30 mm in inner diameter. Each magnetic core was heat-treated at a temperature higher than its crystallization temperature in a magnetic field.

The core volume and the total core loss of each magnetic core are shown in Table 5. Incidentally, the resulting magnetic core materials had substantially the same microstructure as in Example 1.

TABLE 5

| Sample No. | Composition (atomic %) | $B_s$ (T) | Core Volume (Relative Value) | Total Core Loss (Relative Value) | $\lambda_s$ ($\times 10^{-6}$) |
|---|---|---|---|---|---|
| 1 | $Fe_{74}Cu_{0.5}Si_{13.5}B_9Nb_3$ | 1.24 | 0.97 | 0.89 | +1.8 |
| 2 | $Fe_{74}Cu_{1.5}Si_{13.5}B_9Nb_2$ | 1.26 | 0.99 | 0.80 | +2.0 |
| 3 | $Fe_{79}Cu_{1.0}Si_8B_9Nb_3$ | 1.46 | 0.84 | 0.84 | +1.8 |
| 4 | $Fe_{74.5}Cu_{1.0}Si_{13.5}B_6Nb_5$ | 1.16 | 1.01 | 0.91 | +1.5 |
| 5 | $Fe_{77}Cu_1Si_{10}B_9Nb_3$ | 1.43 | 0.86 | 0.88 | +1.6 |
| 6 | $Fe_{73.5}Cu_1Si_{17.5}B_5Ta_3$ | 1.05 | 1.19 | 0.95 | −0.3 |
| 7 | $Fe_{71}Cu_{1.5}Si_{13.5}B_9Mo_5$ | 1.12 | 1.05 | 0.75 | +1.9 |
| 8 | $Fe_{74}Cu_1Si_{14}B_8W_3$ | 1.21 | 0.93 | 0.97 | +1.7 |
| 9 | $Fe_{73}Cu_2Si_{13.5}B_{8.5}Hf_3$ | 1.16 | 1.23 | 0.86 | +2.0 |
| 10 | $Fe_{74.5}Cu_1Si_{13.5}B_9Ta_2$ | 1.28 | 0.91 | 0.91 | +1.8 |
| 11 | $Fe_{72}Cu_1Si_{14}B_8Zr_5$ | 1.17 | 1.18 | 0.93 | +2.0 |

TABLE 5-continued

| Sample No. | Composition (atomic %) | $B_s$ (T) | Core Volume (Relative Value) | Total Core Loss (Relative Value) | $\lambda_s$ ($\times 10^{-6}$) |
|---|---|---|---|---|---|
| 12 | $Fe_{71.5}Cu_1Si_{13.5}B_9Ti_5$ | 1.13 | 1.15 | 0.96 | +1.8 |
| 13 | $Fe_{73}Cu_{1.5}Si_{13.5}B_9Ta_3$ | 1.14 | 1.23 | 0.90 | +1.9 |
| 14 | $Fe_{71}Cu_1Si_{13}B_{10}W_5$ | 1.00 | 1.45 | 0.87 | +2.5 |
| 15 | $Co_{73.3}Fe_{0.7}Mn_3Si_{14}B_9$ Amorphous | 0.83 | 2.09 | 1.0 | nearly 0 |
| 16 | $Fe_{bal}B_{13.5}Si_{13.5}C_2$ Amorphous | 1.60 | 1.0 | 6.38 | +27 |
| 17 | Mn—Zn Ferrite | 0.48 | 16.22 | 1.09 | — |

Note:
Sample Nos. 1-14: Present invention
Sample Nos. 15-17: Conventional cores

As is clear from Table 5, the total core loss is much smaller in the magnetic cores of the present invention than in the conventional amorphous alloys, and with respect to the core volume, the magnetic cores of the present invention are much smaller than those of Co-base amorphous alloy and Mn-Zn ferrite which has relatively small core loss. In addition, the magnetic cores of the present invention generated substantially no beats because they had much smaller magnetostriction than the Fe-base amorphous alloy magnetic core.

EXAMPLE 5

Amorphous ribbons of 15 mm in width and 18 μm in thickness and having compositions shown in Table 6 were produced by a single roll method. Next, each of the ribbons was coated by an MgO insulating layer of about 3 μm in thickness and wound into a toroidal core of 60 mm in outer diameter and 30 mm in inner diameter.

Next, each magnetic core was heat-treated at a temperature higher than its crystallization temperature in a magnetic field. Incidentally, the heat treatment comprised rapid heating by placing the magnetic core in a furnace and cooling at a rate of 2° C./min. The heating time was 1 hour. The heat-treated alloy had the same microstructure as in Example 1. The magnetic properties, core volume, total core loss and magnetostriction of each magnetic core are shown in Table 6.

It is clear from Table 6 that the magnetic cores of the present invention showed smaller total core losses than those produced by crystallizing conventional amorphous alloys. In addition, the magnetic cores of the present invention can have smaller core volume. Accordingly, the high-voltage pulse generating apparatus of the present invention having at least one magnetic switch comprising the above magnetic core shows excellent characteristics which can never be achieved by those containing conventional magnetic cores.

TABLE 6

| Sample No. | Composition (atomic %) | $B_s$ (T) | Core Volume (Relative Value) | Total Core Loss (Relative Value) |
|---|---|---|---|---|
| 1 | $(Fe_{0.959}Co_{0.041})_{73.5}Cu_1Si_{13.5}B_9Nb_3$ | 1.30 | 0.38 | 0.34 |
| 2 | $Fe_{70.5}Cu_1Si_{20.5}B_5Nb_3$ | 1.08 | 0.51 | 0.27 |
| 3 | $(Fe_{0.73}Co_{0.27})_{73.5}Cu_1Si_{13.5}B_9Nb_3$ | 1.23 | 0.37 | 0.35 |
| 4 | $Fe_{75.5}Cu_1Si_{13.5}B_7Nb_3$ | 1.33 | 0.33 | 0.28 |
| 5 | $(Fe_{0.959}Ni_{0.041})_{73.5}Cu_1Si_{13.5}B_9Nb_3$ | 1.23 | 0.45 | 0.28 |
| 6 | $Fe_{72}Cu_1Si_{19}B_5Nb_3$ | 1.14 | 0.48 | 0.21 |
| 7 | $(Fe_{0.60}Co_{0.40})_{73.5}Cu_1Si_{13.5}B_9Nb_3$ | 1.27 | 0.39 | 0.25 |
| 8 | $Fe_{77}Cu_1Si_{10}B_9Nb_3$ | 1.42 | 0.33 | 0.29 |
| 9 | $Fe_{81}Si_{1.9}B_{17.1}$ 40% Amorphous, Balance Crystalline | 1.65 | 1.0 | 1.0 |
| 10 | $Fe_{81}Si_{1.9}B_{17.1}$ 20% Amorphous, Balance Crystalline | 1.65 | 1.32 | 1.87 |

Note:
Sample Nos. 1-8: Present invention
Sample Nos. 9 and 10: Conventional cores

EXAMPLE 6

Amorphous alloy ribbons of 15 mm in width and 18 μm in thickness and having the compositions shown in Table 7 were produced, and each ribbon was coated with mica powder in a thickness of 3 μm. Thereafter, each ribbon was wound into a toroidal core of 60 mm in outer diameter and 30 mm in inner diameter.

Next, the magnetic core was heat-treated at a temperature higher than its crystallization temperature. The heating rate was 10° C./min, the heating temperature was kept for 1 hour, and the cooling rate was 1.5° C./min. The heat-treated alloy had the same microstructure as in Example 1.

Table 7 shows the core volume and the total core loss of each magnetic core. It should be noted that the data are shown as relative values as in Table 4, assuming that the value in the conventional amorphous alloy was 1.

TABLE 7

| Sample No. | Composition (atomic %) | Core* Volume | Total* Core Loss |
|---|---|---|---|
| 1 | $Fe_{71}Cu_1Si_{15}B_9Nb_3Ti_1$ | 0.83 | 0.68 |
| 2 | $Fe_{69}Cu_1Si_{15}B_9W_5V_1$ | 0.99 | 0.73 |
| 3 | $Fe_{69}Cu_1Si_{16}B_8Mo_5Mn_1$ | 1.12 | 0.84 |
| 4 | $Fe_{69}Cu_1Si_{17}B_7Nb_5Ru_1$ | 1.06 | 0.91 |
| 5 | $Fe_{71}Cu_1Si_{14}B_{10}Ta_3Rh_1$ | 1.04 | 0.88 |
| 6 | $Fe_{72}Cu_1Si_{14}B_9Zr_3Pd_1$ | 0.97 | 0.76 |
| 7 | $Fe_{72.5}Cu_{0.5}Si_{14}B_9Hf_3Ir_1$ | 0.95 | 0.92 |
| 8 | $Fe_{70}Cu_2Si_{16}B_8Nb_3Pt_1$ | 1.14 | 0.88 |
| 9 | $Fe_{68.5}Cu_{1.5}Si_{15}B_9Nb_5Au_1$ | 1.34 | 0.93 |
| 10 | $Fe_{71.5}Cu_{0.5}Si_{15}B_9Nb_3Zn_1$ | 1.55 | 0.95 |
| 11 | $Fe_{69.5}Cu_{1.5}Si_{15}B_9Nb_3Mo_1Sn_1$ | 0.84 | 0.74 |
| 12 | $Fe_{68.5}Cu_{2.5}Si_{15}B_9Nb_3Ta_1Re_1$ | 0.89 | 0.81 |
| 13 | $Fe_{70}Cu_1Si_{15}B_9Nb_3Zr_1Al_1$ | 1.28 | 0.83 |
| 14 | $Fe_{70}Cu_1Si_{15}B_9Nb_3Hf_1Sc_1$ | 1.33 | 0.78 |
| 15 | $Fe_{70}Cu_1Si_{15}B_9Hf_3Zr_1Y_1$ | 1.40 | 0.95 |
| 16 | $Fe_{71}Cu_1Si_{15}B_9Nb_3La_1$ | 1.14 | 0.84 |
| 17 | $Fe_{67}Cu_1Si_{17}B_9Mo_5Ce_1$ | 1.25 | 0.77 |
| 18 | $Fe_{67}Cu_1Si_{17}B_9W_5Pr_1$ | 1.51 | 0.83 |
| 19 | $Fe_{67}Cu_1Si_{17}B_9Ta_5Nb_1$ | 1.32 | 0.84 |
| 20 | $Fe_{67}Cu_1Si_{17}B_9Zr_5Sm_1$ | 1.41 | 0.91 |

TABLE 7-continued

| Sample No. | Composition (atomic %) | Core* Volume | Total* Core Loss |
|---|---|---|---|
| 21 | $Fe_{67}Cu_1Si_{16}B_{10}Hf_5Eu_1$ | 1.28 | 0.76 |
| 22 | $Fe_{68}Cu_1Si_{18}B_9Gd_1$ | 1.33 | 0.75 |
| 23 | $Fe_{68}Cu_1Si_{19}B_8Nb_3Tb_1$ | 0.95 | 0.84 |
| 24 | $Fe_{72}Cu_1Si_{14}B_9Nb_3Dy_1$ | 0.84 | 0.80 |
| 25 | $Fe_{72}Cu_1Si_{14}B_9Nb_3Ho_1$ | 0.90 | 0.93 |
| 26 | $Fe_{71}Cu_1Si_{14}B_9Nb_3Cr_1Ti_1$ | 1.18 | 0.85 |
| 27 | $(Fe_{0.95}Co_{0.05})_{72}Cu_1Si_{14}B_9Nb_3Cr_1$ | 1.00 | 1.10 |
| 28 | $(Fe_{0.95}Co_{0.05})_{72}Cu_1Si_{14}B_9Ta_3Ru_1$ | 1.22 | 0.96 |
| 29 | $(Fe_{0.9}Co_{0.1})_{72}Cu_1Si_{14}B_9Ta_3Mn_1$ | 1.10 | 1.05 |
| 30 | $(Fe_{0.99}Ni_{0.01})_{72}Cu_1Si_{14}B_9Ta_3Ru_1$ | 1.25 | 0.84 |
| 31 | $(Fe_{0.95}Ni_{0.05})_{71}Cu_1Si_{14}B_9Ta_3Cr_1Ru_1$ | 1.19 | 0.75 |
| 32 | $(Fe_{0.90}Ni_{0.1})_{68}Cu_1Si_{15}B_9W_5Ti_1Ru_1$ | 1.43 | 0.93 |
| 33 | $(Fe_{0.95}Co_{0.03}Ni_{0.02})_{69.5}Cu_1Si_{13.5}B_9W_5Cr_1Rh_1$ | 1.52 | 1.00 |
| 34 | $(Fe_{0.98}Co_{0.01}Ni_{0.01})_{67}Cu_1Si_{15}B_9W_5Ru_3$ | 1.64 | 0.78 |
| 35 | $Fe_{73}Cu_1Si_{13}B_9Nb_3C_1$ | 1.21 | 0.89 |
| 36 | $Fe_{73}Cu_1Si_{13}B_9Nb_3Ge_1$ | 1.33 | 1.21 |
| 37 | $(Fe_{0.92}Co_{0.08})_{70}Cu_1Si_{13}B_9Nb_5Zn_1As_1$ | 1.25 | 0.88 |
| 38 | $(Fe_{0.96}Co_{0.02}Ni_{0.02})_{70}Cu_1Si_{13}B_9Nb_5Sn_1In_1$ | 1.48 | 0.99 |
| 39 | $Fe_{69}Cu_1Si_{13}B_9Mo_5Re_1C_2$ | 1.34 | 1.01 |
| 40 | $Fe_{69}Cu_1Si_{13}B_9Mo_5Ce_1C_2$ | 1.26 | 1.09 |
| 41 | $Fe_{69}Cu_1Si_{13}B_9W_5Pr_1C_2$ | 1.55 | 0.98 |
| 42 | $Fe_{69}Cu_1Si_{13}B_9W_5Nd_1C_2$ | 1.04 | 1.14 |
| 43 | $Fe_{68}Cu_1Si_{14}B_9Ta_5Gd_1C_2$ | 0.98 | 1.21 |
| 44 | $Fe_{69}Cu_1Si_{13}B_9Nb_5Tb_1C_2$ | 1.38 | 0.95 |
| 45 | $Fe_{70}Cu_1Si_{14}B_8Nb_5Dy_1Ge_1$ | 1.20 | 0.88 |
| 46 | $Fe_{72}Cu_1Si_{13}B_7Nb_5Pd_1Ge_1$ | 1.54 | 0.79 |
| 47 | $Fe_{70}Cu_1Si_{13}B_9Nb_5Ir_1P_1$ | 1.32 | 0.93 |
| 48 | $Fe_{70}Cu_1Si_{13}B_9Nb_5Os_1Ca_1$ | 1.06 | 1.15 |
| 49 | $Fe_{71}Cu_1Si_{14}B_9Ta_3Cr_1C_1$ | 1.11 | 0.84 |
| 50 | $Fe_{67}Cu_1Si_{15}B_6Zr_5V_1C_5$ | 1.38 | 0.88 |
| 51 | $Fe_{63}Cu_1Si_{16}B_5Hf_5Cr_2C_8$ | 1.74 | 0.73 |
| 52 | $Fe_{68}Cu_1Si_{14}B_9Mo_4Ru_3C_1$ | 1.43 | 0.91 |
| 53 | $Fe_{70}Cu_1Si_{14}B_9Mo_3Ti_1Ru_1C_1$ | 1.29 | 0.88 |
| 54 | $Fe_{67}Cu_1Si_{14}B_9Nb_6Rh_2C_1$ | 1.64 | 1.00 |
| 55 | $Fe_{73}Cu_1Si_{13}B_9Nb_3P_1$ | 1.05 | 1.13 |
| 56 | $Fe_{73}Cu_1Si_{13}B_9Nb_3Ca_1$ | 1.19 | 0.95 |
| 57 | $Fe_{73}Cu_1Si_{13}B_9Nb_3Sb_1$ | 1.06 | 0.87 |
| 58 | $Fe_{73}Cu_1Si_{13}B_9Nb_3As_1$ | 1.23 | 0.93 |
| 59 | $Fe_{71}Cu_1Si_{13}B_8Mo_5C_2$ | 1.31 | 0.93 |
| 60 | $Fe_{70}Cu_1Si_{14}B_6Mo_3Cr_1C_5$ | 1.66 | 0.77 |
| 61 | $(Fe_{0.95}Co_{0.05})_{70}Cu_1Si_{13}B_9Nb_5Al_1C_1$ | 1.84 | 0.83 |
| 62 | $(Fe_{0.98}Ni_{0.02})_{70}Cu_1Si_{13}B_9W_5V_1Ge_1$ | 1.77 | 0.99 |
| 63 | $Fe_{68.5}Cu_{1.5}Si_{13}B_9Nb_5Ru_1C_2$ | 1.56 | 0.86 |
| 64 | $Fe_{70}Cu_1Si_{14}B_8Ta_3Cr_1Ru_2C_1$ | 1.62 | 0.87 |
| 65 | $Fe_{70}Cu_1Si_{14}B_9Nb_5Be_1$ | 1.38 | 1.01 |
| 66 | $Fe_{68}Cu_1Si_{15}B_9Nb_5Mn_1Be_1$ | 1.54 | 0.99 |
| 67 | $Fe_{69}Cu_2Si_{14}B_8Zr_5Rh_1In_1$ | 1.90 | 0.91 |
| 68 | $Fe_{71}Cu_2Si_{13}B_7Hf_5Au_1C_1$ | 1.48 | 0.92 |
| 69 | $Fe_{66}Cu_1Si_{16}B_{10}Mo_5Sc_1Ge_1$ | 1.61 | 0.85 |
| 70 | $Fe_{67.5}Cu_{0.5}Si_{14}B_{11}Nb_5Y_1P_1$ | 1.54 | 1.03 |
| 71 | $Fe_{67}Cu_1Si_{13}B_{12}Nb_5La_1Ga_1$ | 1.32 | 1.21 |
| 72 | $(Fe_{0.95}Ni_{0.05})_{70}Cu_1Si_{13}B_9Nb_5Sm_1Sb_1$ | 1.88 | 0.96 |

Note *Relative value

According to the present invention, the high-voltage pulse generating apparatus has at least one magnetic switch comprising a magnetic core made of the Fe-base soft magnetic alloy which shows extremely smaller core loss and higher permeability than the conventional Fe-base or Co-base amorphous alloys.

What is claimed is:

1. A high-voltage pulse generating apparatus having at least one magnetic switch comprising a magnetic core comprising an Fe-base soft magnetic alloy ribbon wound in a toroidal form, said alloy having the composition represented by the general formula:

$$(Fe_{1-a}M_a)_{100-x-y-z-\alpha-\beta-\gamma}Cu_xSi_yB_zM'_\alpha M''_\beta X_\gamma$$
(by atomic %)

wherein M is Co and/or Ni, M' is at least one element selected from the group consisting of Nb, W, Ta, Zr, Hf, Ti and Mo, M'' is at least one element selected from the group consisting of V, Cr, Mn, Al, elements in the platinum group, Sc, Y, rare earth elements, Au, Zn, Sn and Re, X is at least one element selected from the group consisting of C, Ge, P, Ga, Sb, In, Be and As, and a, x, y, z, $\alpha$, $\beta$ and $\gamma$ respectively satisfy $0 \leqq a \leqq 0.5$, $0.1 \leqq x \leqq 3$, $6 \leqq y \leqq 25$, $3 \leqq z \leqq 15$, $14 \leqq y+z \leqq 30$, $1 \leqq \alpha \leqq 10$, $0 \leqq \beta \leqq 10$ and $0 \leqq \gamma \leqq 10$, at least 50% of the alloy ribbon being fine crystalline particles consisting of a bcc Fe solid solution and having an average particle size of 500 Å or less.

2. The high-voltage pulse generating apparatus according to claim 1, wherein said a, x, y, z and a respectively satisfy $0 \leqq a \leqq 0.1$, $0.5 \leqq x \leqq 2$, $10 \leqq y \leqq 25$, $3 \leqq z \leqq 12$, $18 \leqq y+z \leqq 28$ and $2 \leqq \alpha \leqq 8$.

3. The high-voltage pulse generating apparatus according to claim 1 or 2, wherein the balance of said alloy ribbon is substantially amorphous.

4. The high-voltage pulse generating apparatus according to claim 1 or 2, wherein said alloy ribbon substantially consists of said fine crystalline particles.

5. The high-voltage pulse generating apparatus according to claim 1, wherein M' is Nb.

6. The high-voltage pulse generating apparatus according to claim 1, wherein said alloy has a saturation magnetostriction $\lambda_s$ between $+5\times10^{-6}$ and $-5\times10^{-6}$.

7. The high-voltage pulse generating apparatus according to claim 1, wherein said ribbon has a thickness of 5–25 $\mu$m.

8. The high-voltage pulse generating apparatus according to any of claims 1, 2, 5 or 6, wherein said ribbon is partially or totally coated with an insulating layer.

9. The high voltage pulse generating apparatus according to claim 3, wherein said ribbon is partially or totally coated with an insulating layer.

10. The high voltage pulse generating apparatus according to claim 4, wherein said ribbon is partially or totally coated with an insulating layer.

* * * * *